(12) United States Patent
Katsura et al.

(10) Patent No.: US 10,466,073 B2
(45) Date of Patent: Nov. 5, 2019

(54) PROXIMITY SENSOR

(71) Applicant: OMRON Corporation, Kyoto (JP)

(72) Inventors: Hiroto Katsura, Ayabe (JP); Yuki Ushiro, Ayabe (JP); Takaaki Sanda, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 63 days.

(21) Appl. No.: 15/839,871

(22) Filed: Dec. 13, 2017

(65) Prior Publication Data

US 2018/0266851 A1 Sep. 20, 2018

(30) Foreign Application Priority Data

Mar. 14, 2017 (JP) .................. 2017-048296

(51) Int. Cl.
*G01D 5/20* (2006.01)
*H05K 5/00* (2006.01)
*H05K 5/02* (2006.01)
*H05K 5/06* (2006.01)
*G01D 11/24* (2006.01)
(Continued)

(52) U.S. Cl.
CPC ............. *G01D 5/20* (2013.01); *G01D 11/245* (2013.01); *H03K 17/952* (2013.01); *H03K 17/9505* (2013.01); *H05K 3/284* (2013.01); *H05K 5/0039* (2013.01); *H05K 5/0073* (2013.01); *H05K 5/0247* (2013.01); *H05K 5/064* (2013.01); *H05K 1/181* (2013.01); *H05K 2201/09063* (2013.01);
(Continued)

(58) Field of Classification Search
CPC ........ G01D 5/20; G01D 11/245; H05K 3/284; H05K 5/0039; H05K 5/064; H05K 5/0247; H05K 5/0073; H05K 2201/09145; H05K 2203/1316; H05K 2201/10522; H05K 1/181; H05K 2201/09063; H03K 17/952; H03K 17/9505
USPC ............................................ 324/207.15, 200
See application file for complete search history.

(56) References Cited

U.S. PATENT DOCUMENTS

2004/0135572 A1* 7/2004 Nakazaki ............. H03K 17/945
324/200

FOREIGN PATENT DOCUMENTS

CN 1496003 5/2004
CN 105021215 11/2015
(Continued)

OTHER PUBLICATIONS

Office Action of China Counterpart Application, with English translation thereof, dated May 5, 2019, pp. 1-11.

*Primary Examiner* — Farhana A Hoque
(74) *Attorney, Agent, or Firm* — JCIPRNET

(57) ABSTRACT

A proximity sensor in which generation of voids in a resin sealing portion sealing an inside of a housing can be suppressed and thus a yield is improved. The proximity sensor includes a housing, a detection coil, a circuit board and a resin sealing portion. The circuit board is accommodated in the housing to partition an internal space of the housing, and the resin sealing portion covers at least a part of the circuit board by filling the internal space of the housing and thus seals a covered portion of the circuit board. A resin injection port configured to inject a liquid resin forming the resin sealing portion by curing the liquid resin is provided in the housing, and a cutout portion having a
(Continued)

notch shape or an opening shape is provided in the circuit board to include at least a part of a portion facing the resin injection port.

16 Claims, 10 Drawing Sheets

(51) Int. Cl.
*H03K 17/95* (2006.01)
*H05K 3/28* (2006.01)
*H05K 1/18* (2006.01)

(52) U.S. Cl.
CPC .............. *H05K 2201/09145* (2013.01); *H05K 2201/10522* (2013.01); *H05K 2203/1316* (2013.01)

(56) References Cited

FOREIGN PATENT DOCUMENTS

| | | |
|---|---|---|
| CN | 205920960 | 2/2017 |
| JP | 2011165323 | 8/2011 |

\* cited by examiner

PROXIMITY SENSOR

CROSS-REFERENCE TO RELATED APPLICATION

This application claims the priority benefit of Japanese application serial no. 2017-048296, filed on Mar. 14, 2017. The entirety of the above-mentioned patent application is hereby incorporated by reference herein and made a part of this specification.

BACKGROUND

Technical Field

The disclosure relates to a proximity sensor which detects the presence or absence, or a position of a metal body as an object to be detected using a magnetic field, and in particular, to a proximity sensor in which an inside of a housing is sealed with a resin sealing portion.

Description of Related Art

A proximity sensor using a magnetic field is known as a sensor which detects the presence or absence, or a position of a metal body as an object to be detected. Proximity sensors are widely used mainly for various production facilities, industrial robots, and so on.

In a proximity sensor, an inside of the housing is generally sealed with a resin sealing portion. This is because there are many cases in which the surrounding environment in which the proximity sensor is installed is often an extremely severe environment and thus it is necessary to employ a structure having excellent environmental resistance such as water resistance and oil resistance.

For example, in Japanese Unexamined Patent Application Publication No. 2011-165323 (Patent Document 1), a proximity sensor in which an inside of a housing is sealed with a resin sealing portion is disclosed. In the proximity sensor, various components such as a detection coil, a circuit board, and so on are accommodated in the housing, and among them, the circuit board is mainly covered with a resin sealing portion and is sealed.

PATENT DOCUMENTS

[Patent Document 1] Japanese Unexamined Patent Application Publication No. 2011-165323

Usually, the resin sealing portion is formed by injecting a liquid resin from a resin injection port provided in a predetermined portion of the housing and then curing the liquid resin. The liquid resin generally has high viscosity and its flowability is not high. Therefore, particularly, voids tend to be generated easily at a position away from the resin injection port, resulting in deterioration of a yield.

Particularly, in the proximity sensor in which a relatively large circuit board is accommodated to partition an internal space of the housing, a difference in a flow rate is likely to occur in the liquid resin between a space located on one side of a pair of main surfaces of the circuit board and a space located on the other side thereof, and thus when two different flows are generated in the liquid resin and the two flows join together at a position away from the resin injection port, air bubbles are easily entrapped, and as a result, voids are likely to be generated.

Further, in the proximity sensor, cables are led out from the housing to supply electric power or to allow communication with external terminals, but recently, there has also been demand for expansion of the communication function, and the number of cables led into the inside of the housing (in the case of a composite cable, the number of core wires) has tended to increase. As described above, also when the number of cables led into the inside of the housing is large, flowability of the liquid resin inside the housing tends to be lowered, and as a result, voids are likely to be generated.

SUMMARY

A proximity sensor according to an embodiment of the disclosure includes a housing, a detection coil, a circuit board, and a resin sealing portion. The detection coil is accommodated in the housing, and the circuit board is accommodated in the housing to partition an internal space of the housing. A processing circuit electrically connected to the detection coil is provided on the circuit board. The resin sealing portion covers at least a part of the circuit board by filling at least a part of the internal space of the housing and thus seals a covered portion of the circuit board. A resin injection port configured to inject a liquid resin forming the resin sealing portion by curing the liquid resin is provided in the housing. In the proximity sensor according to an embodiment of the disclosure, a cutout portion having a notch shape or an opening shape is provided in the circuit board to include at least a part of a portion facing the resin injection port.

DESCRIPTION OF THE EMBODIMENTS

Figure 1:
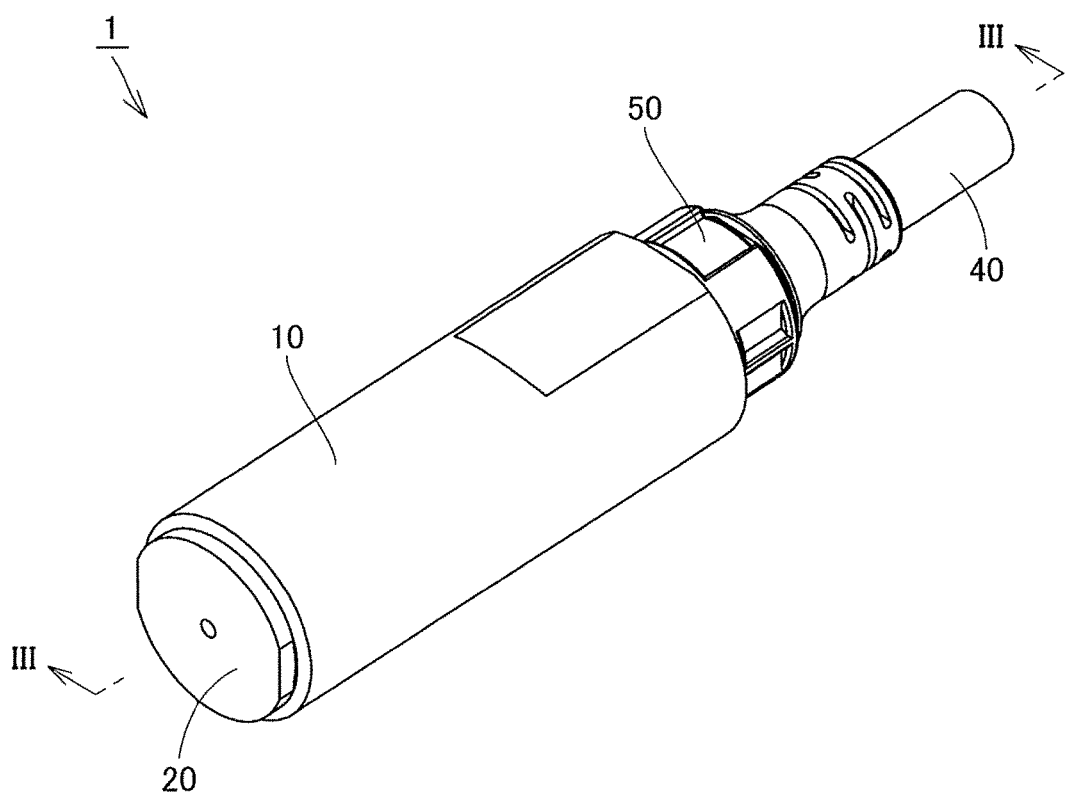
FIG. 1 is a schematic perspective view of a proximity sensor according to an embodiment of the disclosure.

The disclosure provides a proximity sensor in which generation of voids in a resin sealing portion sealing an inside of a housing can be suppressed and thus a yield is improved.

In the proximity sensor according to one or some exemplary embodiments of the disclosure, the housing may include a cylindrical case main body of which a front end and a rear end are open, a bottomed cylindrical coil case configured to accommodate the detection coil and to close the front end of the case main body by being inserted into the front end of the case main body, and a clamp configured to hold a cable connected to the circuit board and to close the rear end of the case main body by being inserted into the rear end of the case main body. In this case, a vent configured to connect the internal space of the housing and an external space of the housing may be provided between the case main body and the coil case. Further, in this case, at least a part of the circuit board may face the clamp, and in this case, the resin injection port may be provided in the clamp.

In the proximity sensor according to one or some exemplary embodiments of the disclosure, the clamp may include a front end portion which is a portion inserted into the case main body in an axial direction of the case main body, a rear end portion which is a portion configured to hold the cable, and an intermediate portion configured to connect the front end portion and the rear end portion, and in this case, the resin injection port may be provided in the intermediate portion.

In the proximity sensor according to one or some exemplary embodiments of the disclosure, the circuit board may extend in the axial direction of the case main body so that a front end thereof is accommodated in the coil case and a rear end thereof is accommodated in the clamp, and in this case, the cutout portion may include a portion configured to continuously extend from a portion facing the resin injection port toward a coil case side in the axial direction of the case main body.

In the proximity sensor according to one or some exemplary embodiments of the disclosure, the cable may include a plurality of core wires and a sheath configured to bundle the plurality of core wires, and in this case, each of the plurality of core wires may be led out from the sheath to bypass the cutout portion and may be connected to the circuit board when seen in a direction in which the resin injection port and the cutout portion are connected.

In the proximity sensor according to one or some exemplary embodiments of the disclosure, all ridge portions of portions of the wiring board included in the circuit board which are sealed by the resin sealing portion may have a rounded shape.

According to one or some exemplary embodiments of the disclosure, it is possible to suppress generation of voids in the resin sealing portion sealing the inside of the housing, thereby improving the yield.

Hereinafter, embodiments of the disclosure will be described in detail with reference to the drawings. Further, in the following embodiments, the same or common parts are denoted by the same reference numerals in the drawings, and description thereof will not be repeated.

Figure 2:
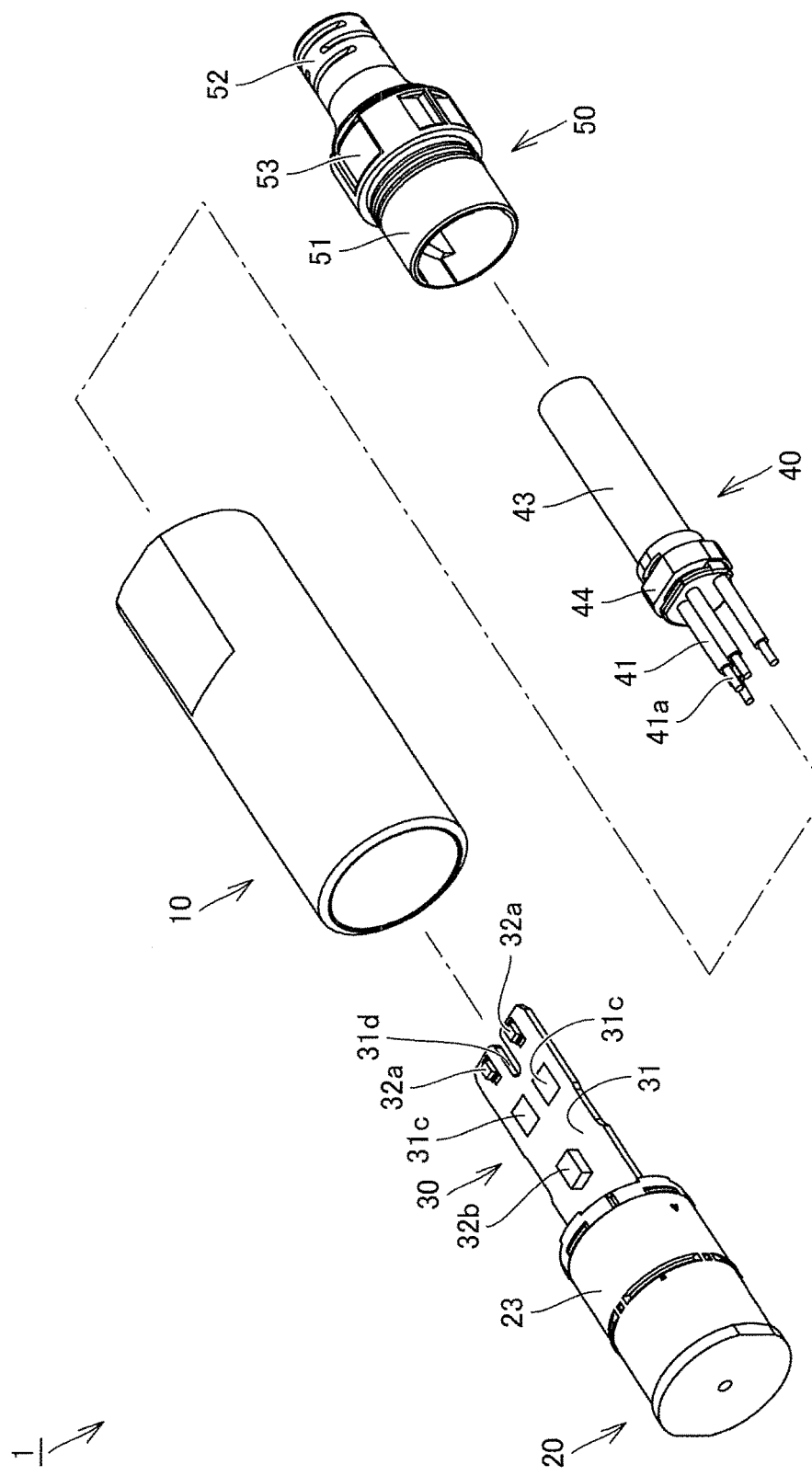
FIG. 2 is an exploded perspective view of the proximity sensor illustrated in FIG. 1.
Figure 3:
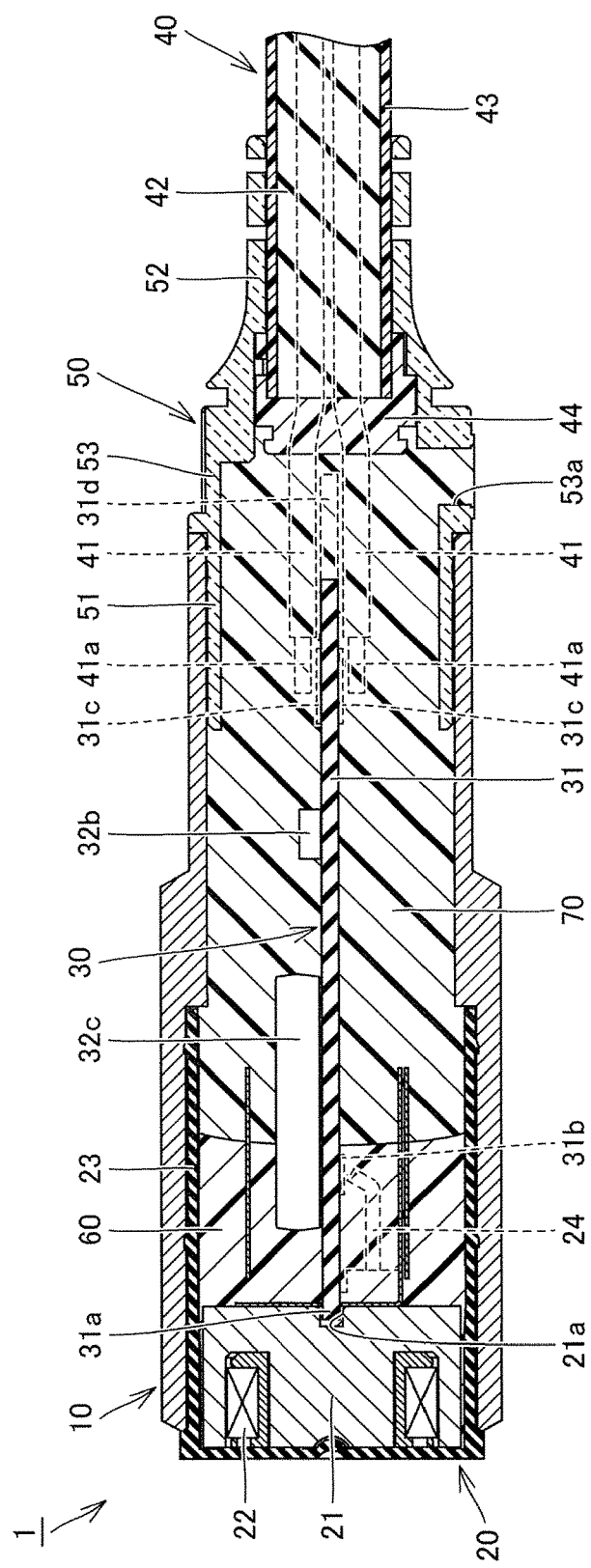
FIG. 3 is a schematic cross-sectional view taken along line illustrated in FIG. 1.
Figure 4:
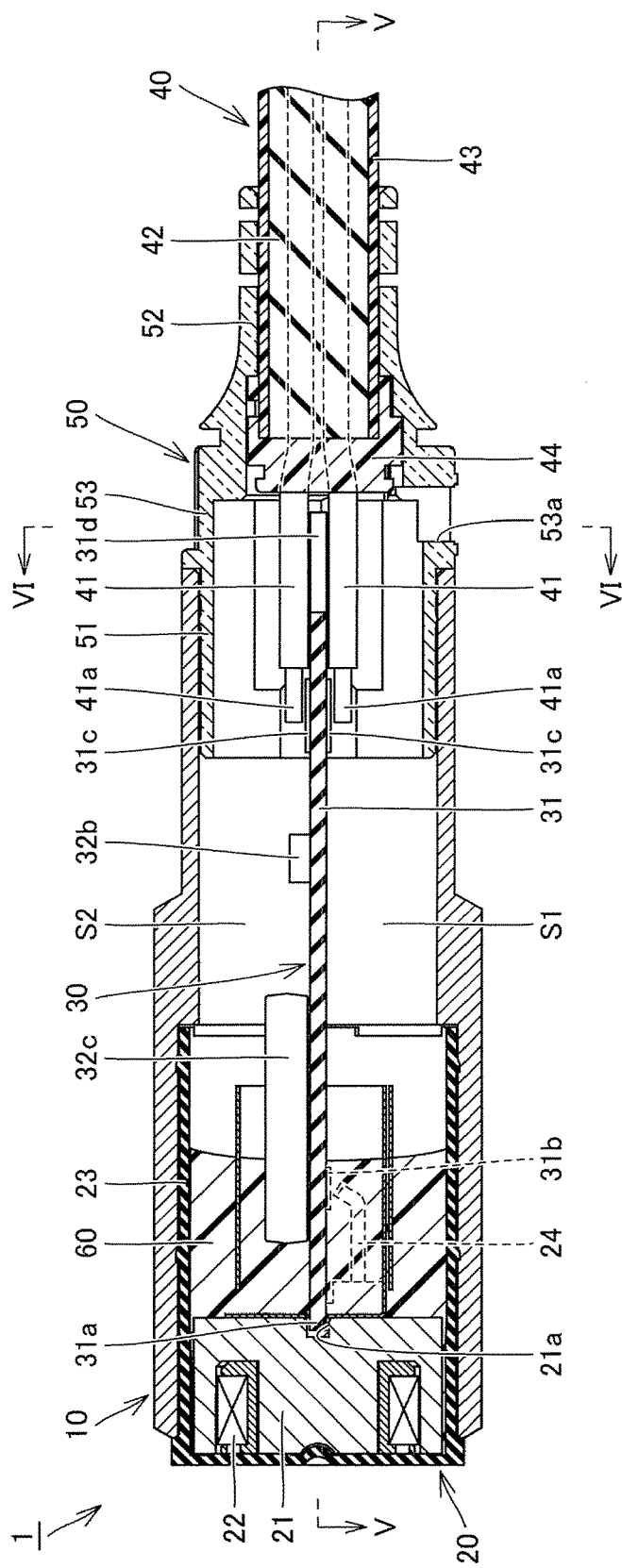
FIG. 4 is a schematic cross-sectional view illustrating a state before a second resin sealing portion of the proximity sensor illustrated in FIG. 1 is formed.
Figure 5:
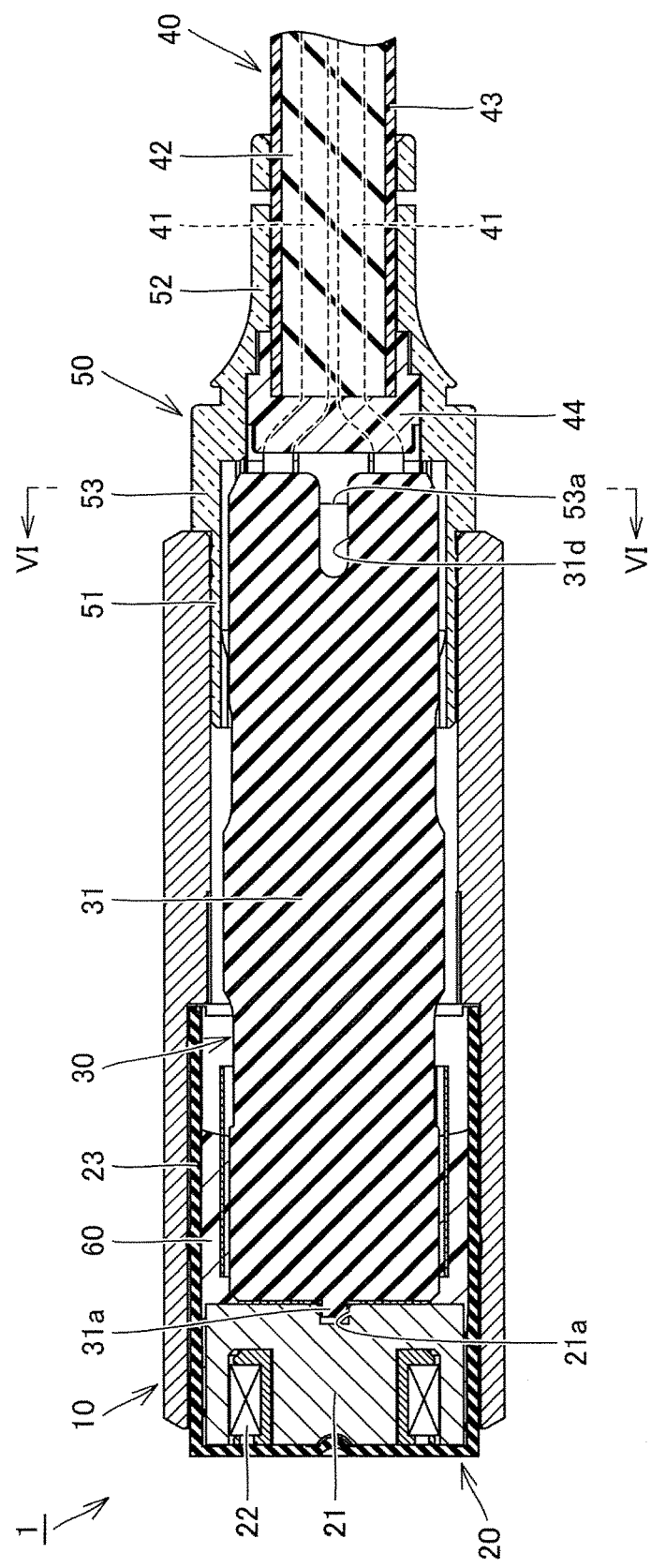
FIG. 5 is a schematic cross-sectional view taken along line V-V in FIG. 4.

FIG. 1 is a schematic perspective view of a proximity sensor according to an embodiment of the disclosure, and FIG. 2 is an exploded perspective view of the proximity sensor illustrated in FIG. 1. FIG. 3 is a schematic cross-sectional view taken along line illustrated in FIG. 1. FIG. 4 is a schematic cross-sectional view illustrating a state before a second resin sealing portion of the proximity sensor illustrated in FIG. 1 is formed, and FIG. 5 is a schematic cross-sectional view taken along line V-V in FIG. 4. First, an entire configuration of a proximity sensor 1 in the embodiment will be described with reference to FIGS. 1 to 5.

As illustrated in FIGS. 1 to 5, the proximity sensor 1 has a substantially cylindrical shape as a whole and includes a case main body 10, a detection part assembly 20, a circuit board 30, a cable 40, a clamp 50, a first resin sealing portion 60, and a second resin sealing portion 70.

As illustrated in FIGS. 3 to 5, a housing of the proximity sensor 1 is mainly configured with the case main body 10, a coil case 23, which will be described later, included in the detection part assembly 20, and a clamp 50, and most of the other components described above are located in an internal space defined by the housing.

Specifically, a core 21 and a detection coil 22, which will be described later, included in the detection part assembly 20, the circuit board 30, and so on are mainly accommodated in the housing. Further, a portion of the cable 40 held by the clamp 50 and located on a front side of the clamp 50 is also accommodated in the housing. In addition, a portion of the cable 40 held by the clamp 50 and located on a rear side of the clamp 50 is led outside of the housing.

Here, in the internal space of the housing, a space excluding the space in which the above-described various components are arranged is filled with the first resin sealing portion 60 and the second resin sealing portion 70. The second resin sealing portion 70 is a resin sealing portion formed by injecting a liquid resin into an inside of the housing after the housing is assembled.

As illustrated in FIGS. 1 to 5, the case main body 10 is formed of a long substantially cylindrical metallic member of which both ends in an axial direction are open and which has a front end and a rear end in the axial direction. The detection part assembly 20 is assembled to the front end of the case main body 10, and the clamp 50 is assembled to the rear end of the case main body 10.

As illustrated in FIGS. 3 to 5, the detection part assembly 20 mainly includes the core 21, the detection coil 22, a coil case 23, and a pair of terminal pins 24. In FIG. 3 and FIG. 4, only one of the pair of terminal pins 24 is illustrated.

The core 21 is formed of a short substantially cylindrical member made of a magnetic material. For example, the detection coil 22 is formed in a substantially cylindrical shape by winding a lead wire. The detection coil 22 is accommodated in an annular concave portion provided in a front end surface of the core 21. Also, a support groove 21a for supporting a protruding portion 31a provided at a tip end of a wiring board 31 which will be described later and which forms the circuit board 30 is provided in a rear end surface of the core 21.

The coil case 23 is formed of a bottomed cylindrical insulating member. The coil case 23 is inserted into a front end of the case main body 10 and fitted to the case main body 10. More specifically, the coil case 23 is press-fitted and fixed to the case main body 10 so that a bottom portion thereof is positioned at the front end of the case main body 10. Accordingly, an opening provided at the front end of the case main body 10 is closed by the coil case 23.

The core 21 and the detection coil 22 are accommodated inside the coil case 23. A front end surface of the core 21 is in contact with the bottom portion of the coil case 23.

A plurality of minute protrusions are provided on an outer circumferential surface of the coil case 23, and thus a vent is provided between the case main body 10 and the coil case 23. In a process in which the liquid resin forming the second resin sealing portion 70 which will described later is injected into the inside of the housing, the vent serves as an exhaust path for exhausting air located inside the housing outside of the housing and is located to connect the internal space of the housing and an external space of the housing.

Each of the pair of terminal pins 24 is provided to protrude rearward from a rear end surface of the core 21. One of the pair of terminal pins 24 is electrically connected to one end of the detection coil 22, and the other of the pair of terminal pins 24 is electrically connected to the other end of the detection coil 22. The pair of terminal pins 24 serve to electrically connect the detection coil 22 with a processing circuit, which will be described later, provided on the circuit board 30.

As illustrated in FIGS. 2 to 5, the circuit board 30 is disposed at a rear of the core 21 to extend in the axial direction of the case main body 10. A front end of the circuit board 30 is accommodated in the coil case 23, and a rear end thereof is accommodated in the clamp 50.

The circuit board 30 includes the wiring board 31 in which a predetermined conductive pattern is formed on front and back surfaces thereof, and various electronic components 32a to 32c mounted at predetermined positions on the front and rear surfaces of the wiring board 31. The protruding portion 31a protruding toward the core 21 side is provided at a front end of the wiring board 31, and the protruding portion 31a is inserted into the support groove 21a provided in the core 21.

The circuit board 30 is disposed to overlap an axial line of the case main body 10, and thus the internal space of the housing is partitioned into a first space S1 located on one side of a pair of main surfaces of the wiring board 31 and a second space S2 located on the other side of the pair of main surfaces of the wiring board 31.

Figure 6:
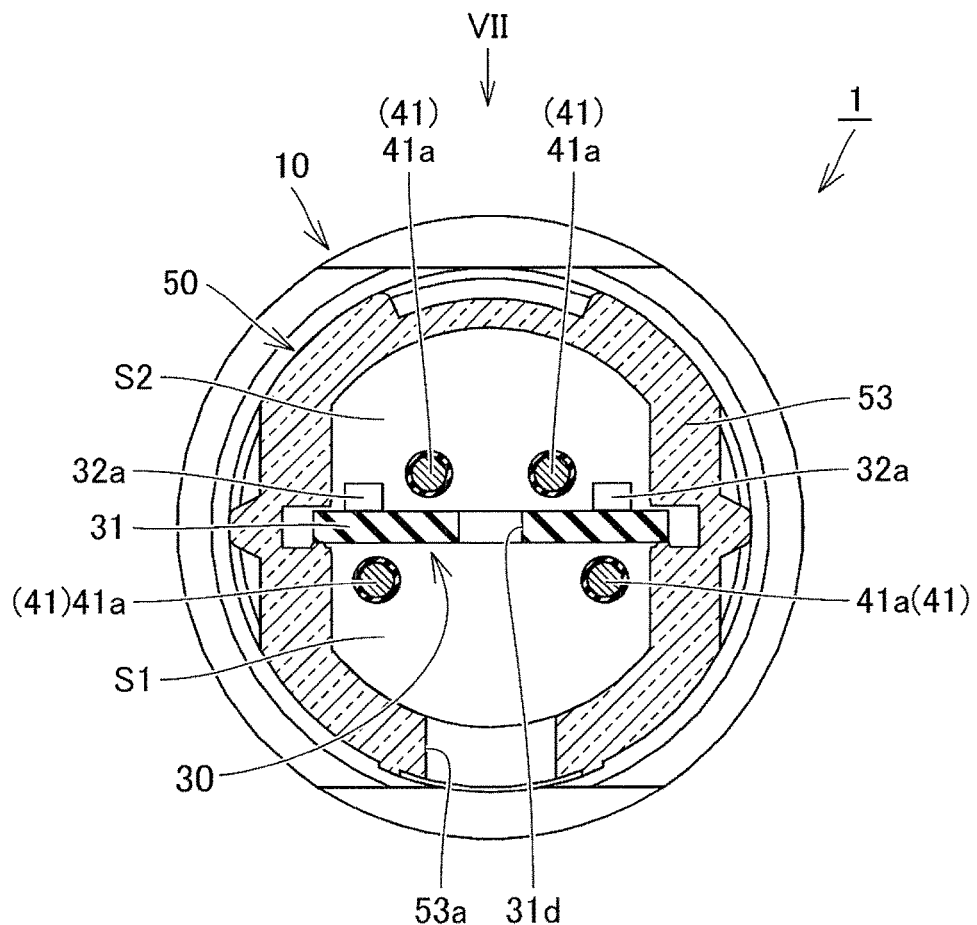
FIG. 6 is a schematic cross-sectional view taken along line VI-VI illustrated in FIGS. 4 and 5.

Here, referring to FIG. 5, the wiring board 31 has a substantially rectangular shape in plan view and is disposed so that three sides of four sides defining a contour line thereof excluding one side located on the core 21 side are not basically in contact with other components except for the first resin sealing portion 60 and the second resin sealing portion 70 (however, referring to FIG. 6, a part of an outer circumferential edge of a rear end of the wiring board 31 is held by the clamp 50). Therefore, the first space S1 and the second space S2 are connected to each other at this portion.

A pair of lands 31b connected to correspond to the above-described pair of terminal pins 24 are provided at predetermined positions on the front end of the wiring board 31, and thus the detection coil 22 and the processing circuit which will be described later are electrically connected to each other. For connecting the lands 31b and the terminal pins 24, for example, solder or the like which is not illustrated is used.

A plurality of lands 31c connected to correspond to conductive wires 41a included in a plurality of core wires 41 of the cable 40 which will be described later are provided at predetermined positions on the rear end portion of the wiring board 31. For connecting the lands 31c and the conductive wires 41a, for example, solder or the like which is not illustrated is used.

Further, a notch-shaped cutout portion 31d is provided at the rear end of the wiring board 31, and a configuration and a function thereof will be described later.

Here, among the various electronic components 32a to 32c mounted on the wiring board 31, a pair of electronic components 32a mounted on the rear end portion of the wiring board 31 are light emitting elements which emit light when energized. The light emitting elements emit light in accordance with an operation state of the proximity sensor 1 and are configured with, for example, light emitting diodes (LEDs).

Various processing circuits are formed on the circuit board 30. The processing circuit includes an oscillation circuit using the detection coil 22 as a resonance circuit element or a discrimination circuit which compares an oscillation amplitude of the oscillation circuit with a threshold value and binarizes the oscillation amplitude. Further, an output circuit which converts an output of the discrimination circuit into a voltage output or a current output of a predetermined specification, or a power supply circuit which converts electric power introduced from outside into that of a predetermined power supply specification and then outputs the converted electric power is also provided on the circuit board 30. In addition, a light emitting element driving circuit which controls driving of a pair of electronic components 32a as the above-described pair of light emitting elements is also provided on the circuit board 30.

The various circuits are configured with the conductive pattern provided on the wiring board 31, the above-described electronic components 32a to 32c of various types, the detection coil 22, and so on.

As illustrated in FIGS. 2 to 4, the cable 40 is configured with a composite cable composed of a plurality of core wires 41 each including the conductive wire 41a, and a shield material 42 and a sheath 43 which cover the plurality of core wires 41. The cable 40 is disposed to be inserted through the opening on the rear end side of the case main body 10, one end thereof is electrically connected to the above-described various circuits by being connected to the above-described wiring board 31, and the other end thereof is led out toward the outside.

Herein, the shield material 42 and the sheath 43 are peeled off so that the plurality of core wires 41 are exposed at the above-described one end of the cable 40, and a coating material of the core wire 41 is also peeled off at each of ends of the plurality of core wires 41 connected to correspond to the plurality of lands 31c so that the conductive wires 41a are exposed.

Further, a plug 44 is provided at a front end position on the sheath 43 of the cable 40. The plug 44 is a member for preventing generation of a gap between the cable 40 and the clamp 50, and the cable 40 is held by the clamp 50 via the plug 44. The above-described plurality of core wires 41 are led out forward from the front end of the plug 44.

In the embodiment, the cable 40 includes a total of four core wires 41. Two of the four core wires 41 are led out from the shield material 42 and the sheath 43 toward the above-described first space S1 side, and the remaining two core wires 41 are led out from the shield material 42 and the sheath 43 toward the above-described second space S2 side.

As illustrated in FIGS. 2 to 4, the clamp 50 has a substantially cylindrical shape, and the cable 40 is inserted through the clamp 50. The clamp 50 is fitted to the case main body 10 by being inserted into the rear end of the case main body 10. More specifically, a part of the clamp 50 is located inside the case main body 10 and is press-fitted and fixed to the case main body 10 so that the remaining portion thereof is located outside the case main body 10. Therefore, the opening provided at the rear end of the case main body 10 is closed by the clamp 50 and the cable 40 held by the clamp 50.

Specifically, the clamp 50 includes a front end portion 51, a rear end portion 52 and an intermediate portion 53 in the axial direction of the case main body 10, the front end portion 51 is configured with a cylindrical portion which is inserted into the case main body 10, the rear end portion 52 is configured with a substantially cylindrical portion which holds the cable 40, and the intermediate portion 53 is configured with a substantially cylindrical portion which connects the front end portion 51 and the rear end portion 52. Among them, the front end portion 51 and the intermediate portion 53 face the circuit board 30, and the plug 44 is fitted to the rear end portion 52.

The clamp 50 is formed of a resin member to be elastically deformable and has a function of relieving stress applied to the cable 40 and stress applied to the plug 44.

Further, a resin injection port 53a is provided at a predetermined position on the intermediate portion 53. The resin injection port 53a serves as an inlet into which a liquid resin is poured in a process in which the liquid resin forming the second resin sealing portion 70 described later is injected into the inside of the housing. Further, as illustrated in FIG. 3, After the second resin sealing portion 70 is formed, the resin injection port 53a is closed by the second resin sealing portion 70.

Here, in the embodiment, the clamp 50 is formed of a non-lighttight resin material. Accordingly, it is possible to transmit light emitted from each of the pair of electronic components 32a as the above-described pair of light emitting elements to the outside via the clamp 50.

As illustrated in FIGS. 3 to 5, the first resin sealing portion 60 seals the core 21, the detection coil 22 and the terminal pin 24 which are accommodated in the coil case 23, and the front end of the circuit board 30. The first resin sealing portion 60 serves to protect the core 21, the detection coil 22, the terminal pin 24, and the front end of the circuit board 30 and to seal them air-tightly and liquid-tightly from the outside.

The first resin sealing portion 60 is formed by assembling the circuit board 30 to the detection unit assembly 20 before assembling the detection part assembly 20 to the case main body 10 and then injecting and curing the liquid resin into the coil case 23 in this state. Further, for example, an epoxy resin, a PUR resin, or the like may be suitably used as a material of the first resin sealing portion 60.

As illustrated in FIG. 3, a space in the internal space defined by the housing which excludes the space sealed by the above-described first resin sealing portion 60 is filled with the second resin sealing portion 70. Therefore, a portion of the circuit board 30 excluding the above-described front end and a portion of the cable 40 located on a front side of the plug 44 are sealed by the second resin sealing portion 70. The second resin sealing portion 70 serves to protect the portion of the circuit board 30 excluding the above-described front end and the portion of the cable 40 located on the front side of the plug 44 and to seal them air-tightly and liquid-tightly from the outside.

The second resin sealing portion 70 is formed by injecting the liquid resin through the resin injection port 53a of the clamp 50 and curing the liquid resin as described above. Further, an epoxy resin, or the like may be suitably used as a material of the second resin sealing portion 70.

Here, in the embodiment, the second resin sealing portion 70 is formed of a non-lighttight resin material. Therefore, it is possible to transmit the light emitted from each of the pair of electronic components 32a as the above-described pair of light emitting elements to the outside via the second resin sealing portion 70.

Figure 7:
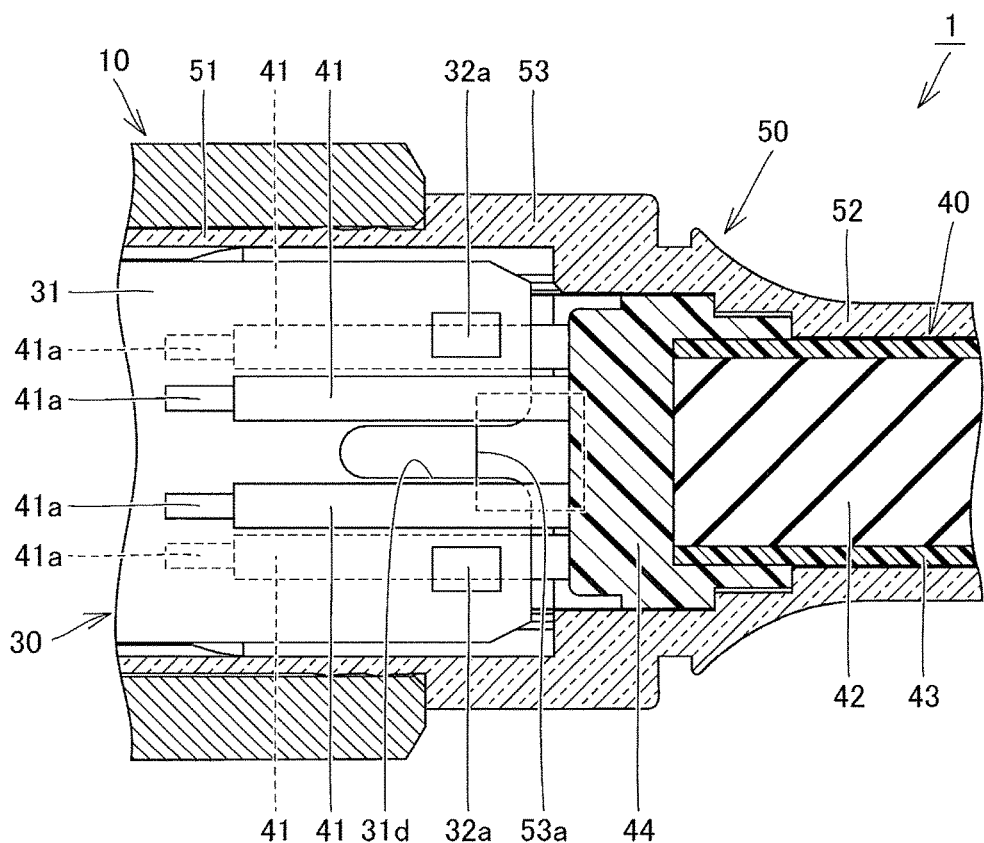
FIG. 7 is a schematic enlarged view of a main part as seen in a direction of an arrow VII illustrated in FIG. 6.
Figure 8:
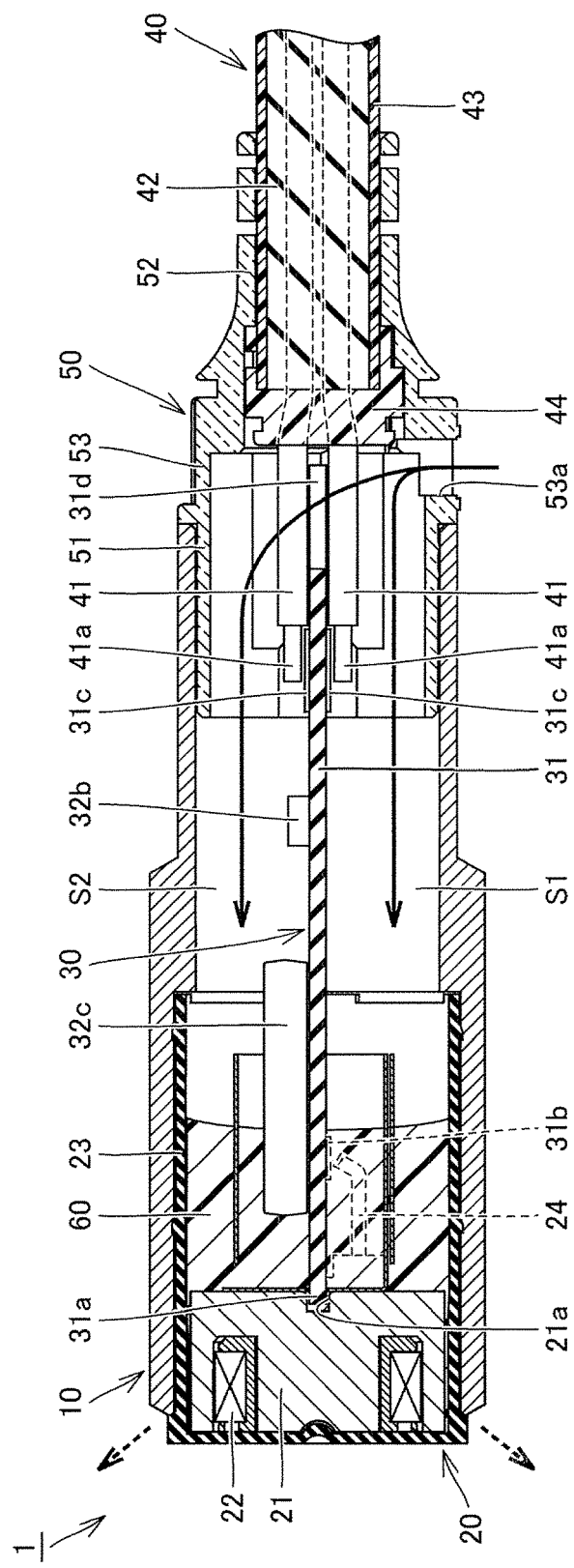
FIG. 8 is a view schematically illustrating a flowing direction of a liquid resin forming the second resin sealing portion in the proximity sensor illustrated in FIG. 1.

FIG. 6 is a schematic cross-sectional view taken along line VI-VI illustrated in FIGS. 4 and 5, and FIG. 7 is a schematic enlarged view of a main part as seen in a direction of an arrow VII illustrated in FIG. 6. Further, FIG. 8 is a view schematically illustrating a flowing direction of the liquid resin forming the second resin sealing portion in the proximity sensor illustrated in FIG. 1. Next, with reference to FIGS. 6 to 8, a configuration in the vicinity of the resin injection port 53a of the proximity sensor 1 in the embodiment will be described in detail, and a direction in which the liquid resin flows in the process in which the liquid resin forming the second resin sealing portion 70 is injected will be described.

As illustrated in FIGS. 6 and 7, the rear end of the circuit board 30 is disposed inside the intermediate portion 53 of the clamp 50, and the resin injection port 53a provided in the intermediate portion 53 of the clamp 50 is located so that a part thereof faces the circuit board 30.

Here, the cutout portion 31d is provided on the wiring board 31 of the circuit board 30 to include a part of the portion facing the resin injection port 53a. Specifically, the notch-shaped cutout portion 31d is provided to extend from a central portion of one of the above-described four sides defining the contour line of the wiring board 31, which is located on the plug 44 side, toward the inside of the wiring board 31 (that is, to extend in the axial direction of the case main body 10).

Due to the above-described configuration, in the process in which the liquid resin forming the second resin sealing portion 70 is injected into the inside of the housing, the first space S1 and the second space S2 communicate with each other at the rear end of the circuit board 30 via the cutout portion 31d in advance.

Accordingly, as illustrated in FIG. 8, when the liquid resin forming the second resin sealing portion 70 is injected into the inside of the housing, the injected liquid resin flows toward the first space S1 side and also flows smoothly toward the second space S2 side via the cutout portion 31d (further, in FIG. 8, the flow of the liquid resin is schematically illustrated by solid line arrows).

As a result, it is difficult for a large difference to occur between a flow rate of the liquid resin flowing in the first space S1 and a flow rate of the liquid resin flowing in the second space S2, and the liquid resin moving from a position on the rear end side of the housing to a position on the front end side of the housing flows in a lump state.

Therefore, the air in the first space S1 and the second space S2 may be smoothly discharged outside of the housing via the vent provided between the case main body 10 and the coil case 23, and thus it is possible to reduce a risk of air bubbles being entrained into the liquid resin (further, in FIG. 8, a state in which the air is discharged is schematically illustrated by broken line arrows).

Therefore, by using the proximity sensor 1 in the embodiment, generation of voids in the second resin sealing portion 70 which seals the inside of the housing may be suppressed, and thus a yield may be improved.

Particularly, in the proximity sensor 1 in the embodiment, as described above, a relatively large circuit board 30 is accommodated to partition the internal space of the housing, and also the cable 40 includes four core wires 41 which are relatively large to expand the communication function, but even under such conditions, it is possible to greatly suppress the generation of the voids in the second resin sealing portion 70 which seals the inside of the housing by having the above-described configuration.

Here, as illustrated in FIG. 7, the notch-shaped cutout portion 31d provided at the rear end of the wiring board 31 of the circuit board 30 includes a portion which continuously extends from a portion facing the resin injection port 53a toward the coil case side (that is, the front side) in the axial direction of the case main body 10. Due to such a configuration, the flow of the liquid resin toward the second space S2 is more smoothly performed, and thus an effect in which the generation of the voids is suppressed may be further enhanced.

Further, each of the plurality of core wires 41 is led out from the shield material 42 and the sheath 43 to bypass the cutout portion 31d and is connected to the circuit board 30 when seen in a direction in which the resin injection port 53a and the cutout portion 31d are connected (that is, direction orthogonal to a paper surface of the drawing in FIG. 7). Due to such a configuration, it is possible to prevent the flow of the liquid resin from being blocked by the plurality of core wires 41 in the vicinity of the cutout portion 31d, and it is also possible to realize a smooth flow of the liquid resin toward the second space S2.

Here, the pair of core wires 41 led out toward the first space S1 which is a space on the side in which the resin injection port 53a is located (that is, the pair of core wires 41 of which part is illustrated by a broken line in FIG. 7) do not overlap either the resin injection port 53a or the cutout portion 31d when seen in the direction in which the resin injection port 53a and the cutout portion 31d are connected. Meanwhile, the pair of core wires 41 led out toward the second space S2 which is a space on the side in which the resin injection port 53a is not located (that is, the pair of core wires 41 indicated by a solid line in FIG. 7) are in a state in which at least the cutout portion 31d is not completely covered when seen in the direction in which the resin injection port 53a and the cutout portion 31d are connected.

Further, a method in which each of the plurality of core wires 41 is configured to bypass the cutout portion 31d may be easily realized by, for example, changing an extending direction of the core wire 41 by the plug 44 at a portion in which the plug 44 is assembled.

Further, the resin injection port 53a and the cutout portion 31d are not necessarily completely overlapped with each other, and in the case of such a configuration, it may also be supposed reversely that the voids are likely to be generated, although it depends on manufacturing conditions. This is because, when the cutout portion 31d is too large, most of the liquid resin injected from the resin injection port 53a passes through the cutout portion 31d and flows into the second space S2 as it is, and thus it is apprehended that a large difference may occur between the flow rate of the liquid resin flowing in the first space S1 and the flow rate of the liquid resin flowing in the second space S2.

Therefore, as illustrated in FIGS. 6 to 8, the resin injection port 53a and the cutout portion 31d are provided so that the cutout portion 31d is overlapped with a part of the resin injection port 53a in both of a width direction (that is, in a radial direction of the case main body 10) and in a lengthwise direction (that is, in the axial direction of the case main body 10) when seen in the direction in which the resin injection port 53a and the cutout portion 31d are connected.

Figure 9:
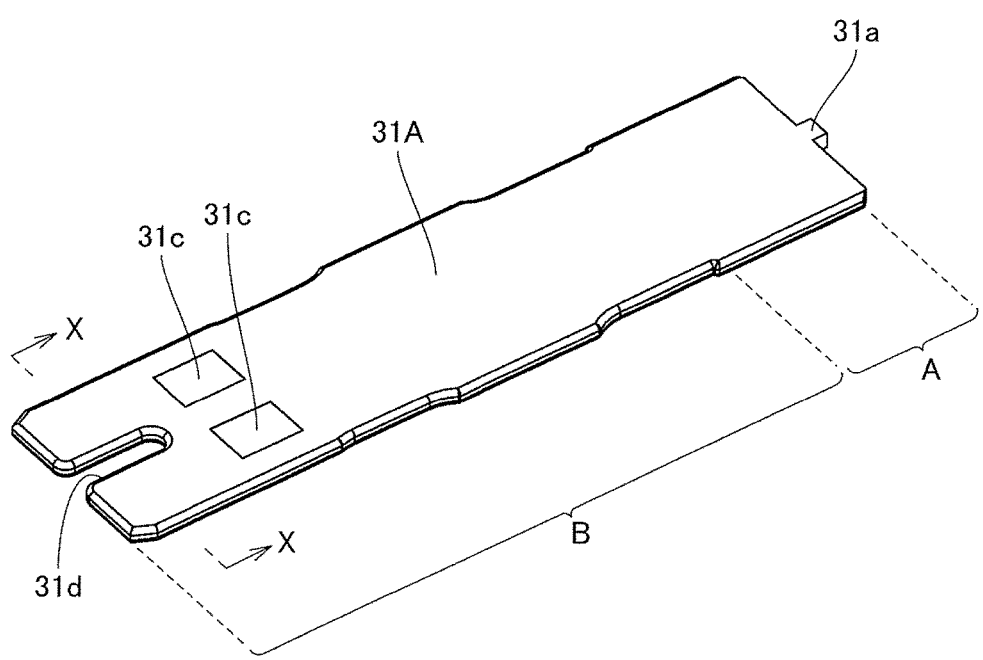
FIG. 9 is a perspective view of a wiring board of a proximity sensor according to a first modified example.
Figure 10:
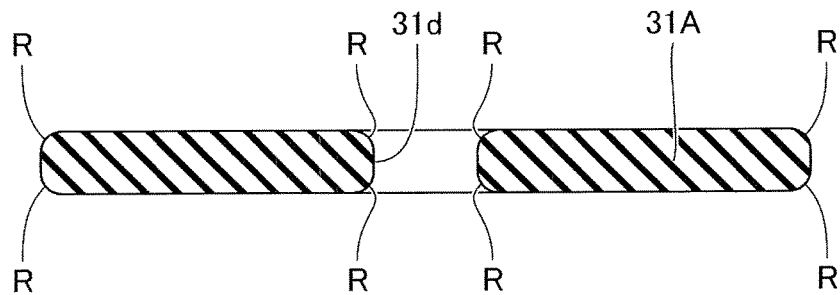
FIG. 10 is a cross-sectional view taken along line X-X illustrated in FIG. 9.

FIG. 9 is a perspective view of a wiring board of a proximity sensor according to a first modified example on the basis of the embodiment of the disclosure, and FIG. 10 is a cross-sectional view taken along line X-X illustrated in FIG. 9. Hereinafter, the proximity sensor according to the first modified example will be described with reference to FIGS. 9 and 10.

The proximity sensor according to the first modified example has the basically same structure as that of the proximity sensor 1 according to the above-described embodiment of the disclosure but is different from the proximity sensor 1 in that a wiring board 31A illustrated in FIGS. 9 and 10 is provided instead of the wiring board 31 included in the circuit board 30.

As illustrated in FIGS. 9 and 10, the wiring board 31A is a board in which a ridge portion of a certain portion in a ridge portion in which a pair of main surfaces and a plurality of circumferential surfaces connecting the pair of main surfaces are connected is formed to be rounded. Specifically, in a region A of the wiring board 31A illustrated in FIG. 9 which is covered by the first resin sealing portion 60, the ridge portion is not formed to be rounded, and in a region B illustrated in FIG. 9 which is covered by the second resin sealing portion 70, the ridge portion is formed to be rounded.

Here, the fact that the ridge portion is formed to be rounded means that the ridge portion (portion indicated by a reference symbol R) appearing on a sectional surface thereof (that is, a cross section as illustrated in FIG. 10) has a curved shape when the wiring board 31A is cut in a direction orthogonal to the pair of main surfaces. Such a rounded portion of the ridge portion may be easily realized by performing a polishing operation of corners of the wiring board formed by punching.

In the case of such a configuration, since flow resistance against the liquid resin passing through an edge of the wiring board 31A is suppressed to be low in the process in which the liquid resin forming the second resin sealing portion 70 is injected into the inside of the housing, the flow of the liquid resin is more smoothly performed, and as a result, the effect in which the generation of the voids is suppressed may be enhanced.

Further, the reason why the ridge portion is not formed to be rounded in the region A illustrated in FIG. 9 is that the portion is not covered with the second resin sealing portion 70, and the ridge portion may also be formed to be rounded in the region A. Further, in the region B illustrated in FIG. 9, not only the ridge portions of the portions forming the cutout portion 31d are formed to be rounded but also the ridge portions of the portions not forming the cutout portion 31d are also formed to be rounded.

Figure 11:
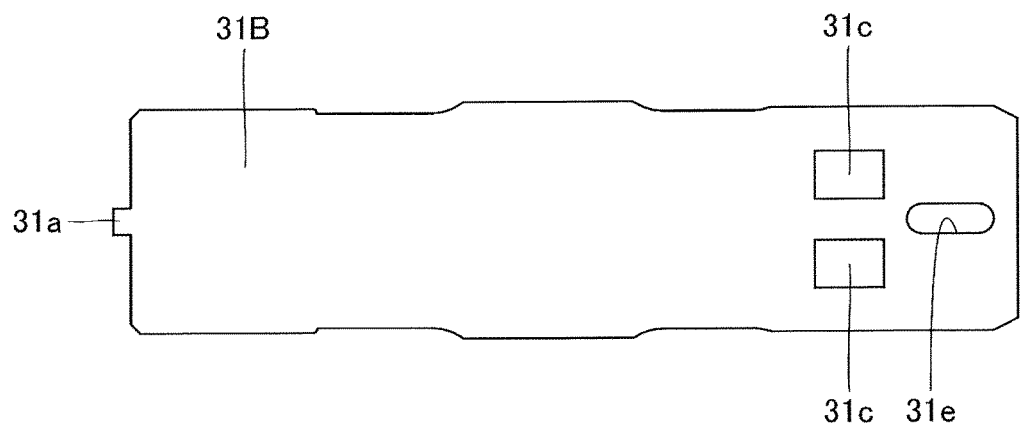
FIG. 11 is a plan view of a wiring board of a proximity sensor according to a second modified example.

FIG. 11 is a plan view of a wiring board of a proximity sensor according to a second modified example on the basis of the above-described embodiment of the disclosure. Hereinafter, the proximity sensor according to the second modified example will be described with reference to FIG. 11.

The proximity sensor according to the second modified example has the basically same structure as that of the proximity sensor 1 according to the above-described embodiment of the disclosure but is different from the proximity sensor 1 in that a wiring board 31B illustrated in FIG. 11 is provided instead of the wiring board 31 included in the circuit board 30.

As illustrated in FIG. 11, the wiring board 31B has an opening-shaped cutout portion 31e at a predetermined position of a portion close to a rear end thereof. The cutout portion 31e is formed to include a part of a portion of the wiring board 31B facing the resin injection port 53a.

Even when the opening-shaped cutout portion 31e is provided instead of the notch-shaped cutout portion as described above, in the process in which the liquid resin forming the second resin sealing portion 70 is injected into the inside of the housing, the first space S1 and the second space S2 communicate with each other at the rear end of the circuit board 30 via the cutout portion 31e in advance.

Accordingly, like the case of the above-described embodiment of the disclosure, even in the case in which such a configuration is applied, when the liquid resin forming the second resin sealing portion 70 is injected into the inside of the housing, some of the injected liquid resin flows smoothly via the cutout portion 31e, and thus it is possible to reduce a risk of air bubbles being entrained into the liquid resin, and as a result, the generation of the voids in the second resin sealing portion 70 which seals the inside of the housing may be suppressed.

In the embodiment according to the disclosure and the modified examples thereof, the case in which the resin injection port is provided in the clamp forming a part of the housing has been described as an example, but a position in which the resin injection port is provided is not particularly limited, and the resin injection port may be provided in the case main body or the coil case. Even in this case, the generation of the voids can be effectively suppressed by providing the cutout portion in the circuit board to include at least a part of a portion facing a position in which the resin injection port is provided.

Further, in the embodiment according to the disclosure and the modified examples thereof, the case in which the liquid resin is injected from a portion close to the rear end of the housing so that the liquid resin flows from the rear end side to the front end side inside the housing has been described as an example, but an injection position or a flowing direction of the liquid resin is not particularly limited, and the liquid resin may be injected from a position close to the front end of the housing, a central position thereof, or the like.

Further, in the embodiment according to the disclosure and the modified examples thereof, the case in which the housing is configured with the case main body, the coil case and the clamp has been described as an example, but the housing may be configured with a single member or may be configured with two or four or more members.

Further, in the embodiment according to the disclosure and the modified examples thereof, the case in which the internal space of the housing is filled with the first resin sealing portion and the second resin sealing portion has been described as an example, but it is not always necessary to adopt such a configuration, and the first resin sealing portion may be omitted so that it is filled only with the second resin sealing portion.

Further, in the embodiment according to the disclosure and the modified examples thereof, the case in which the cable is configured with the composite cable having a total of four core wires has been described as an example, but the number of core wires may be two, three, or five or more. Furthermore, various types of cables can be used, for example, a composite cable not having the shielding material, or a lead wire (non-composite cable) composed of a conductive wire and a coating material covering the conductive wire may be used.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A proximity sensor comprising:
    a housing,
    a detection coil accommodated in the housing,
    a circuit board accommodated in the housing to partition an internal space of the housing and having a processing circuit electrically connected to the detection coil, and
    a resin sealing portion configured to cover at least a part of the circuit board by filling at least a part of the internal space of the housing and to seal a covered portion of the circuit board,
    wherein a resin injection port configured to inject a liquid resin forming the resin sealing portion by curing the liquid resin is provided in the housing, and a cutout portion having a notch shape or an opening shape is provided in the circuit board to include at least a part of a portion facing the resin injection port, wherein
    the housing includes a cylindrical case main body of which a front end and a rear end are open, a bottomed cylindrical coil case configured to accommodate the detection coil and to close the front end of the case main body by being inserted into the front end of the case main body, and a clamp configured to hold a cable connected to the circuit board and to close the rear end of the case main body by being inserted into the rear end of the case main body,
    a vent configured to connect the internal space of the housing and an external space of the housing is provided between the case main body and the coil case,
    at least a part of the circuit board faces the clamp, and
    the resin injection port is provided in the clamp.

2. The proximity sensor according to claim 1, wherein
    the clamp includes a front end portion which is a portion inserted into the case main body in an axial direction of the case main body, a rear end portion which is a portion configured to hold the cable, and an intermediate portion configured to connect the front end portion and the rear end portion, and
    the resin injection port is provided in the intermediate portion.

3. The proximity sensor according to claim 2, wherein
    the circuit board extends in the axial direction of the case main body so that a front end thereof is accommodated in the coil case and a rear end thereof is accommodated in the clamp, and
    the cutout portion includes a portion configured to continuously extend from a portion facing the resin injection port toward a coil case side in the axial direction of the case main body.

4. The proximity sensor according to claim 3, wherein
    the cable includes a plurality of core wires and a sheath configured to bundle the plurality of core wires, and
    each of the plurality of core wires is led out from the sheath to bypass the cutout portion and is connected to the circuit board when seen in a direction in which the resin injection port and the cutout portion are connected.

5. The proximity sensor according to claim 3, wherein all ridge portions of portions of a wiring board included in the circuit board which are sealed by the resin sealing portion have a rounded shape.

6. The proximity sensor according to claim 4, wherein all ridge portions of portions of a wiring board included in the circuit board which are sealed by the resin sealing portion have a rounded shape.

7. The proximity sensor according to claim 2, wherein
    the cable includes a plurality of core wires and a sheath configured to bundle the plurality of core wires, and
    each of the plurality of core wires is led out from the sheath to bypass the cutout portion and is connected to the circuit board when seen in a direction in which the resin injection port and the cutout portion are connected.

8. The proximity sensor according to claim 7, wherein all ridge portions of portions of a wiring board included in the circuit board which are sealed by the resin sealing portion have a rounded shape.

9. The proximity sensor according to claim 2, wherein all ridge portions of portions of a wiring board included in the circuit board which are sealed by the resin sealing portion have a rounded shape.

10. The proximity sensor according to claim 1, wherein
the circuit board extends in the axial direction of the case main body so that a front end thereof is accommodated in the coil case and a rear end thereof is accommodated in the clamp, and
the cutout portion includes a portion configured to continuously extend from a portion facing the resin injection port toward a coil case side in the axial direction of the case main body.

11. The proximity sensor according to claim 10, wherein
the cable includes a plurality of core wires and a sheath configured to bundle the plurality of core wires, and
each of the plurality of core wires is led out from the sheath to bypass the cutout portion and is connected to the circuit board when seen in a direction in which the resin injection port and the cutout portion are connected.

12. The proximity sensor according to claim 11, wherein all ridge portions of portions of a wiring board included in the circuit board which are sealed by the resin sealing portion have a rounded shape.

13. The proximity sensor according to claim 10, wherein all ridge portions of portions of a wiring board included in the circuit board which are sealed by the resin sealing portion have a rounded shape.

14. The proximity sensor according to claim 1, wherein
the cable includes a plurality of core wires and a sheath configured to bundle the plurality of core wires, and
each of the plurality of core wires is led out from the sheath to bypass the cutout portion and is connected to the circuit board when seen in a direction in which the resin injection port and the cutout portion are connected.

15. The proximity sensor according to claim 14, wherein all ridge portions of portions of a wiring board included in the circuit board which are sealed by the resin sealing portion have a rounded shape.

16. The proximity sensor according to claim 1, wherein all ridge portions of portions of a wiring board included in the circuit board which are sealed by the resin sealing portion have a rounded shape.

* * * * *